United States Patent [19]

Nagata et al.

[11] 3,961,210

[45] June 1, 1976

[54] PIEZOELECTRIC DOT RESONATOR DRIVEN AT A HARMONIC OVERTONE

[75] Inventors: Takashi Nagata, Ikeda, Japan; Raymond David Mindlin, Ridgefield, Conn.

[73] Assignee: Matsushita Electric Industrial Co., Ltd., Osaka, Japan

[22] Filed: Dec. 2, 1974

[21] Appl. No.: 528,869

Related U.S. Application Data

[63] Continuation of Ser. No. 352,646, April 19, 1973.

[52] U.S. Cl. ............................ 310/9.5; 310/8.2; 310/9.6; 310/9.7; 310/9.8
[51] Int. Cl.² .................. H01L 41/04; H01L 41/18
[58] Field of Search .......................... 310/9.5–9.8, 310/8

[56] References Cited
UNITED STATES PATENTS

| | | | |
|---|---|---|---|
| 3,222,622 | 12/1965 | Curran et al...................... | 310/9.5 X |
| 3,363,119 | 1/1968 | Koneval et al...................... | 310/9.5 |
| 3,384,768 | 5/1968 | Shockley et al. .................... | 310/9.5 |
| 3,401,276 | 9/1968 | Curran et al............................ | 310/9 |

*Primary Examiner*—Mark O. Budd
*Attorney, Agent, or Firm*—Wenderoth, Lind and Ponack

[57] ABSTRACT

A piezoelectric device comprisng a thin plate of a piezoelectric material which has a Poisson's ratio of less than one-third, and has an electrode region and a non-electrode region, wherein the thickness relation between the electode region and the non-electrode region is arranged so that the thickness of the electrode region is smaller than the thickness of the non-electrode region when a value of equations represented by $(\pi p/4)+(4/k^3)\cot(\pi kp/2) \gtrless Q$ for the thickness-extensional mode, and $(\pi q/4)+(4/k)\cot(\pi q/2k) \gtrless Q$ for the thickness-shear mode is negative respectively for a desired vibratory mode, and that the thickness of the electrode region is larger than the thickness of the non-electrode region when the value of the above equations are positive respectively for a desired thickness vibration mode.

6 Claims, 9 Drawing Figures

PIEZOELECTRIC DOT RESONATOR DRIVEN AT A HARMONIC OVERTONE

This application is a continuation of application Ser. No. 352,646, filed Apr. 19, 1973.

BACKGROUND OF THE INVENTION

This invention relates to a piezoelectric device, and particularly relates to a piezoelectric device vibrating in the thickness mode of vibration at a pre-selected frequency with suppressed unwanted vibration responses.

The resonance frequency of a piezoelectric plate vibrating in the thickness mode is inversely proportional to the thickness of the plate. Accordingly, by using a thin piezoelectric plate, the piezoelectric device can be widely used in a high frequency range.

However, conventionally such a thickness mode piezoelectric device has a defect in that it is difficult to suppress or to eliminate the unwanted vibration responses which exist in the wanted thickness vibration responses at/or near that response.

Several methods have been proposed to overcome this defect. For example, U.S. Pat. No. 2,249,933 discloses a method of making the electrode area smaller than one half of the area of the piezoelectric plate. U.S. Pat. No. 3,384,768 discloses a method of making the resonance frequency of a region of resonator where the electrode is applied lower than that of the region having no electrodes thereon. On the other hand, U.S. Pat. No. 3,363,119 discloses a method of providing a recess and electrodes on the piezoelectric plate so as to make the resonance frequency range of the portion of the plate having the electrode thereon lower than the range of the portion of the plate having no electrode thereon. Further, the literature entitled "High Frequency Crystal Filters Employing Multiple Mode Resonators Vibrating in Trapped Energy Mode," Proc. 20th Annual Symposium on Frequency Control, pp 266 to 287, April 1966 discloses a piezoelectric device having a symmetric and anti-symmetric trapped mode, which has a structure with a plurality of partially limited electrodes on a piezoelectric plate.

Although many efforts to overcome the problem have been made, it is still difficult to eliminate successfully the unwanted vibration responses from any piezoelectric plate. Especially it is difficult to eliminate successfully the unwanted vibration responses from the harmonic overtones of the thickness mode of any piezoelectric plate.

SUMMARY OF THE INVENTION

It is, therefore, an object of the present invention to provide a novel and improved piezoelectric device vibrating in the thickness mode which is free from unwanted vibration responses.

A further object of the present invention is to provide a novel and improved piezoelectric device having a smooth response of the desired thickness vibration of any piezoelectric plate.

These and other objects are achieved by providing a piezoelectric device comprising a thin and flat plate of a piezoelectric material having a Poisson's ratio of less than one-third and electrode regions and non-electrode regions on the major surfaces thereon, the thickness of said electrode region being principally determined by the value of equations represented by $\{(\pi p/4)+(4/K^3)\cot(\pi kp/2)\}$ for the thickness-extensional mode, and $\{(\pi q/4)+(4/k)\cot(\pi q/2k)\}$ for the thickness-shear mode, in which $\pi$ is a circular constant, $p$ and $q$ are numbers of harmonic overtones of thickness-extensional mode and thickness-shear mode vibrations, respectively, and $k$ is a function of the Poisson's ratio, and the equivalent thickness of the electrode region being slightly smaller or larger than the thickness of the non-electrode region for the case when the value of the above equations is negative or positive, respectively.

BRIEF DESCRIPTION OF THE DRAWINGS

These and other objects and the advantages of the present invention will become apparent from the following description taken in connection with the attached drawings, wherein.

DETAILED DESCRIPTION OF THE PREFERRED EMBODIMENT

Figure 1:
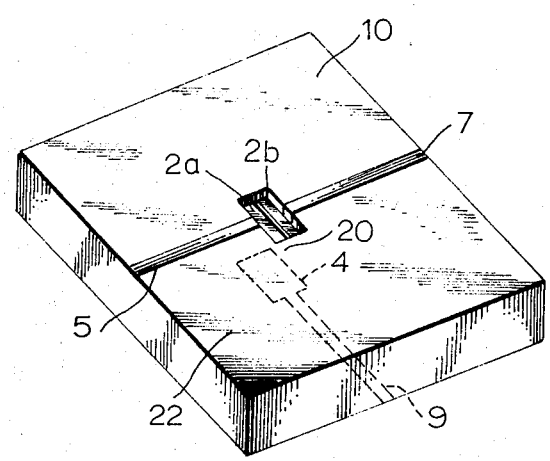
FIG. 1 is a perspective view of a piezoelectric device according to the present invention.

Referring to FIG. 1, a piezoelectric device according to the present invention comprises a thin plate designated by a reference numeral 10 of piezoelectric material which has an electrode region 20 and a non-electrode region 22. On the electrode region 20, there are deposited electrodes 2a and 2b on one major surface at the position as shown in FIG. 1 and an electrode 4 at the corresponding position on the opposite major surface, and on the non-electrode region there are applied electrical terminals 5, 7 and 9.

For the material of the piezoelectric plate 10, operable materials include any monocrystalline piezoelectric material or piezoelectric ceramic material when the Poisson's ratio of which is less than one third. For example, lead titanate piezoelectric ceramics are suitable for the piezoelectric plate. It has been disclosed that lead titanate piezoelectric ceramics containing additives have a value of Poisson's ratio as low as one fifth, for example, by Ikegami et al. in Journal of the Acoustical Society of America, Vol. 50, No. 4, Part 1, pp 1060 to 1066, October, 1971. The direction of polarization of the piezoelectric plate 10 is determined according to the thickness-extensional vibration which is produced when an electrical signal is applied between the electrodes 2a and 4 and/or 2b and 4 through the corresponding electrical terminals.

The electrodes 2a, 2b and 4 and the electrical terminals 5, 7 and 9 are prepared by conventional methods such as electroless metal plating, metal evaporation and firing of a silver composition. For a fine construction, a method used for providing an electrode for integral circuitry produces a good result.

It is necessary that the electrical terminals are not in a superposed relation on the opposite major surfaces of the piezoelectric plate. When the electrical terminals are superposed, a piezoelectric effect is produced in the material between the terminals causes adverse unwanted vibration responses.

The thickness of the electroded region is determined so as to make the resonance frequency of the fundamental thickness-extensional vibration the same as a preselected frequency. The thickness relation between the electrode and non-electrode region is especially important and the thickness of the electrode region is smaller than that of the non-electrode region, as described hereinafter.

Figure 2:
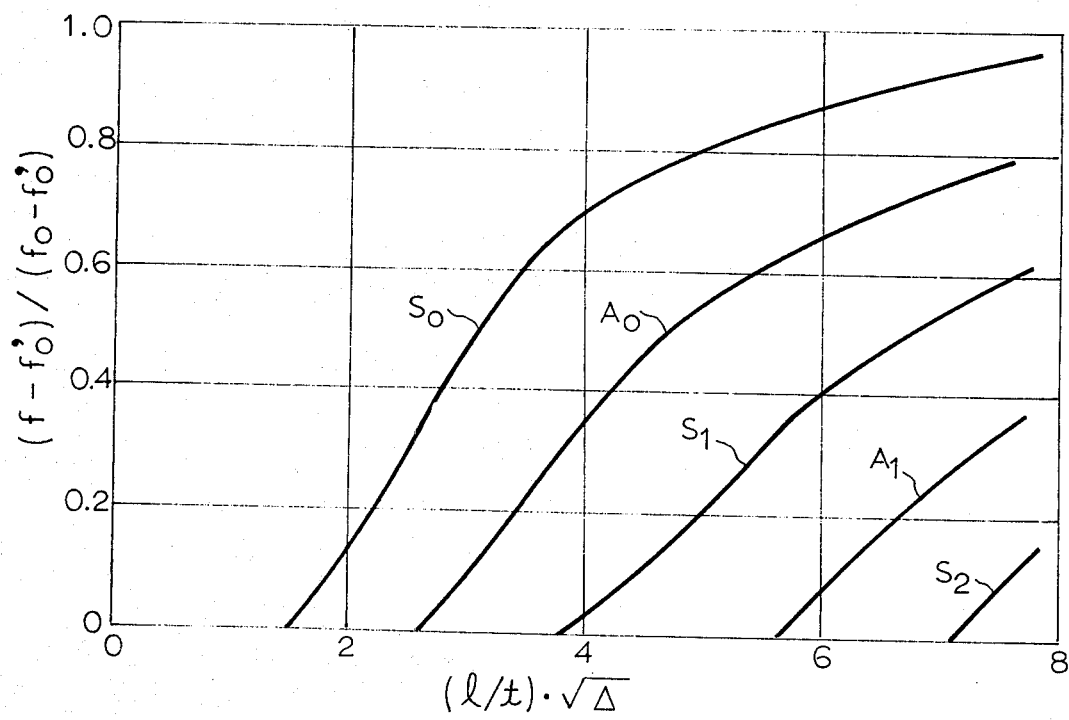
FIG. 2 is a frequency spectrum for determining the dimensions of the electrode region of the piezoelectric device shown in FIG. 1.

Referring to FIG. 2, there is shown a frequency spectrum of a vibratory mode of the electrode region in FIG. 1 relating to the fundamental vibration in the thickness-extensional mode. In FIG. 2, the ordinate shows a normalized frequency where f is a resonance frequency of the vibratory mode at the electrode region, and $f_o'$ and $f_0$ are the cut-off frequencies of the fundamental vibration of the thickness-extensional mode on the non-electrode region and the electroded region, respectively. The abscissa shows a shape factor where l is the length of electrode, t is the thickness of electrode region and $\Delta$ is represented by $\Delta = (f_0 - f_o')/f_o'$. The curves $S_0, S_1 \ldots$ and $a_0, a_1 \ldots$ represent the resonance frequencies of the vibratory mode of the electrode region. The curves represented by S and $a$ show respectively the symmetric and anti-symmetric vibrations of the vibratory mode. Each suffix corresponds to the number of anharmonic undertones of those vibrations.

Figure 4:
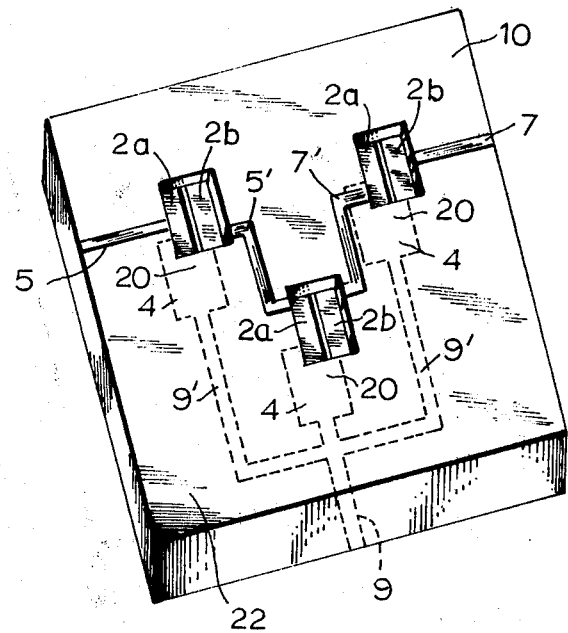

It will be understood from FIG. 2 that the resonance frequency of the desired vibratory mode can only exist in the portion between the cut-off frequencies $f_0$ and $f_o'$. Under this condition, the desired vibration has a characteristic that it does not propagate to the non-electrode region, because the propagation constant of the wave of the desired vibration is imaginary at the non-electrode region and the vibration is attenuated exponentially at the boundary of the non-electrode region. As a result, unwanted vibrations are not induced, since there is no reflection boundary. The cut-off frequencies $f_0$ and $f_o'$ are substantially inversely proportional to the thickness of the vibrated plate. Therefore, the thickness of the electrode region of FIG.

terminals 5 and 9. Such a band pass filter response is available for the value of the shape factor $(1/t)\sqrt{\Delta}$ from 2.6 to 3.8. Under the condition that the symmetric and anti-symmetric mode of $S_0$ and $a_0$ are induced at the electrode region, a multiple mode filter can be constructed, for example, as shown in FIG. 4. FIG. 4 shows a modified form of the piezoelectric device which consists of a cascade connection of the piezoelectric device as shown in FIG. 1. Each reference numeral represents the same part as the part in FIG. 1, including the dashed ones.

Further details including the inventive concept will be explained in the following. Whether a wave of vibration is able to propagate through the piezoelectric plate or not depends on whether the propagation constant is a real number or an imaginary number. According to the present invention, vibration confined in the electrode region of the piezoelectric plate has a propagation constant as small as zero in the real numbers. On the other hand, the propagation constant becomes an imaginary number in the non-electrode region. It has been found that such a condition can be simply forecast by following equations, each of which is a deduction from a mathematical treatment, for the thickness-extensional vibration:

$$\frac{\pi P}{4} + \frac{4}{k^3}\cot\frac{\pi k p}{2} \gtrless 0, p=1, 3, 5 \quad (1)$$

and for the thickness-shear vibration:

$$\frac{\pi p}{4} - \frac{4}{k}\cot\frac{\pi q}{2k} \gtrless 0, q=1, 3, 5 \quad (2)$$

where $\pi$ is a circular constant, $p$ and $q$ are the numbers of the harmonic overtones of the thickness-extensional mode and thickness-shear mode vibrations, respectively, and $k$ is a function of the Poisson's ratio $\sigma$ and is represented by $k = \{2(1-\sigma)/(1-2\sigma)\}^{1/2}$. The equations (1) and (2) give the curvatures of dispersion curves of the thickness-extensional mode and thickness-shear mode vibrations, respectively at zero propagation constants. Table 1 shows calculated results of the equations (1) and (2) for piezoelectric plates of materials having various Poisson's ratios.

Strictly speaking, the equations (1) and (2) are representations for an isotropic plate and an anisotropy of a piezoelectric plate is neglected. But the result seems not to be widely different as is described hereinafter.

Table 1

| p,q | thickness-extensional mode | | | | | | thickness-shear mode | | | | | |
|-----|---|---|---|---|---|---|---|---|---|---|---|---|
| $\sigma$ | p=1 | 3 | 5 | 7 | 9 | 11 | 13 | q=1 | 3 | 5 | 7 | 9 | 11 | 13 |
| 0.20 | − | + | + | + | + | − | + | + | − | + | + | + | − |
| 0.30 | − | + | + | + | + | + | + | + | − | + | + | − | + |
| 0.34 | + | + | + | + | + | + | + | + | + | + | + | + | + | l should be smaller than the thickness of the non-electrode region so as to satisfy the condition described hereinabove.

Figure 3:
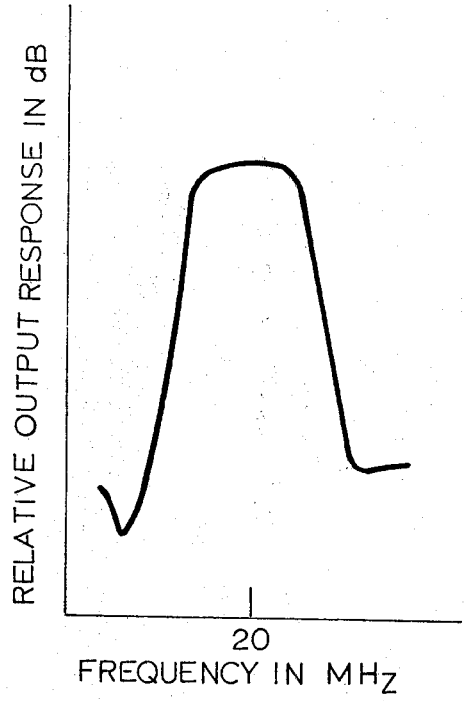
FIG. 3 is a graphic representation of the frequency response characteristic of the piezoelectric device in FIG. 1, FIGS. 4 and 5 are perspective views of modified forms of the piezoelectric device of the present invention.

Referring to FIG. 3, there is represented a frequency response characteristic of the device of FIG. 1. The characteristic of a band pass filter as shown is provided for an output response at the electrical terminals 7 and 9, when an input signal is applied between the electrical The subject of the present invention is based on the fact that the thickness relation between the electrode region and non-electrode region can be determined by the value of the equation (1) or (2). When the value is negative, the thickness of the electrode region should be smaller than the thickness of non-electrode region. On the other hand, the thickness of electrode region should be larger than the thickness of the non-electrode region for positive values of the equation (1) or (2). Therefore, there exists a satisfactory condition in which a desired vibration of the thickness mode is confirmed at the electrode region, by keeping the relation as described above.

According to the invention, the method of confining the thickness vibration in the electrode region is not always the same even when the piezoelectric plate is fixed. For example, for a piezoelectric plate having a Poisson's ratio of one fifth in Table 1, the thickness of the electrode region for the fundamental and 11th harmonic overtones of the thickness-extensional vibration. On the other hand the thickness of the electrode region should be larger than the thickness of the non-electrode region for the 3rd, 5th, 7th, 9th and 13th harmonic overtones of the thickness-extensional vibration, as shown in Table 1.

Figure 5:
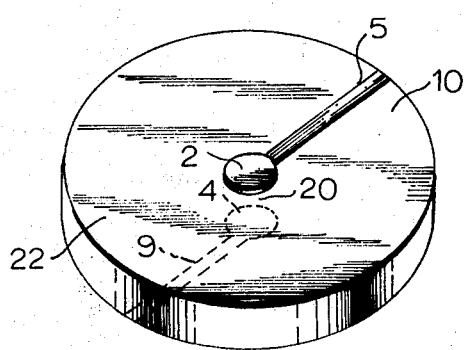

Referring to FIG. 5, a modified piezoelectric device of the present invention is shown. In FIG. 5, each reference numeral represents a part similar to that designated by the corresponding reference numeral in FIG. 1. A plate 10 is of a piezoelectric material which has a Poisson's ratio of less than one third. A desired vibration at the electroded region 20 is selected from 3rd, 5th, 7th and 9th harmonic overtones of the thickness-extensional mode. The thickness of the electrode region is arranged to be larger than the thickness of the non-electrode region.

Figure 6:
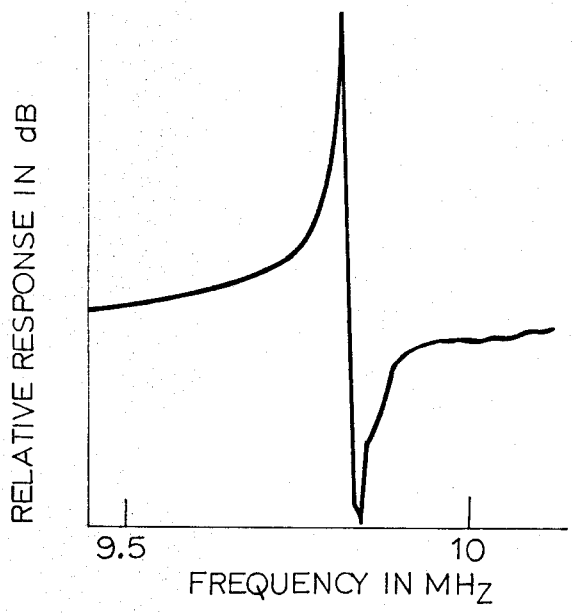
FIGS. 6 and 7 are graphic representations of frequency responses of the 3rd and 5th harmonic overtones of the thickness-extensional mode of a piezoelectric device of FIG. 5, and FIGS. 8 and 9 are graphic representations of frequency responses of the fundamental and 11th harmonic overtones of the thickness-extensional mode of the piezoelectric device of FIG. 4.
Figure 7:
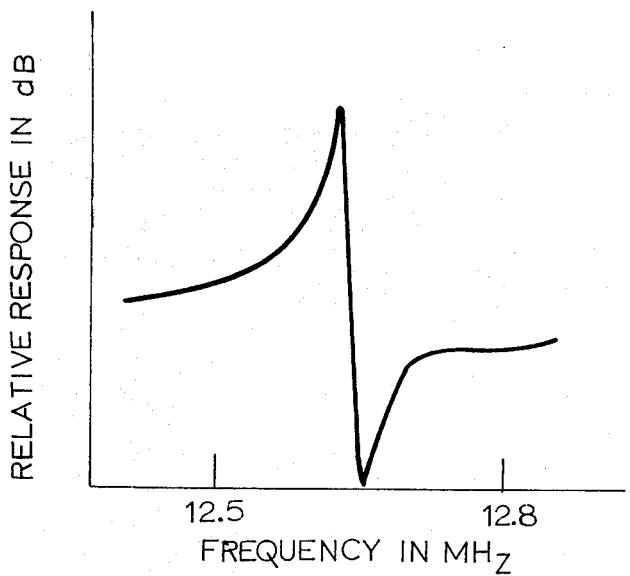
Figure 8:
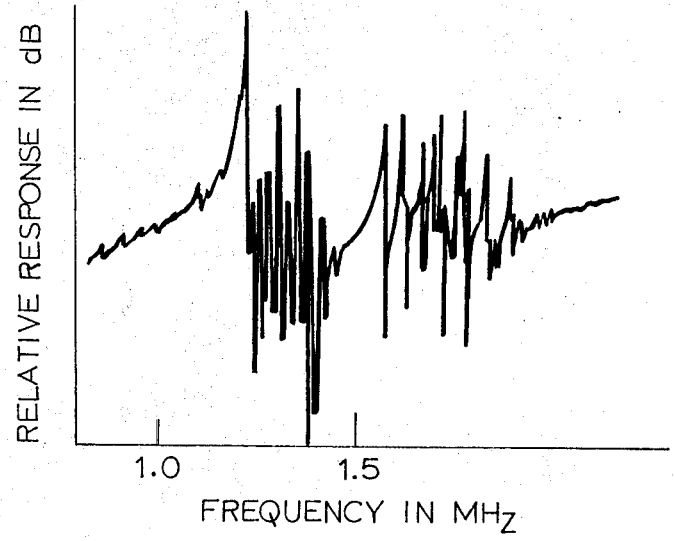
Figure 9:
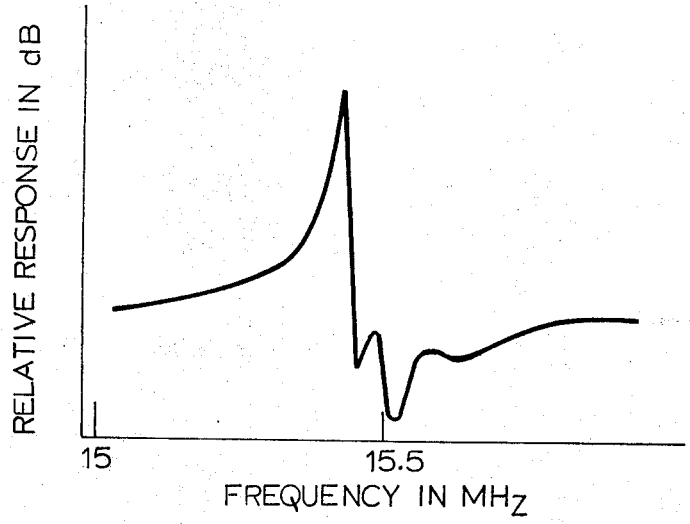

FIGS. 6 to 9 represent typical frequency response curves of a piezoelectric device of FIG. 5, which consists of a modified lead titanate piezoelectric ceramic plate having a Poisson's ratio of one fifth. The thickness of the electrode region is controlled by adjusting the thickness of the electrode. FIGS. 6 and 7 are the frequency response curves of 7th and 9th harmonic overtones of the thickness-extensional mode, respectively. FIGS. 8 and 9 are the frequency response curves of the fundamental and 11th harmonic overtones of the thickness-extensional mode, respectively. The frequency response curves of FIGS. 6 and 7 have smooth single-tuned responses, while those curves of FIGS. 8 and 9 have complex responses owing to unwanted vibrations. Comparing those curves and Table 1, it is clearly understood that the smooth responses of the desired vibration are available when the thickness is adjusted by the rule of the invention described herein above.

While several embodiments of the invention have been disclosed in the above, it will be apparent that many additional structural and compositional variations are possible without departing from the scope of the invention as defined in the appended claims.

We claim:

1. A piezoelectric device comprising a thin plate of piezoelectric material having electrode regions and non-electrode regions on the major surfaces thereof and at least one pair of electrodes provided on said electrode region, said electrode regions having a thickness so as to vibrate in one of the harmonic overtones of the thickness-extensional mode at a preselected frequency when an electrical signal is applied to said pair of electrodes, the thickness of said non-electrode regions being greater than that of said electrode regions, the cut-off frequency of said harmonic overtone at said non-electrode regions being lower than the cut-off frequency of said harmonic overtone at said electrode regions, and the relation of said piezoelectric material and said harmonic overtone represented by $\{(\pi p/4)+(4/k^3)\cot(\pi kp/2)\}$ being negative, where $\pi$ is a circular constant, $p$ is a number of a harmonic overtone of the thickness-extensional mode ($p=3,5\ldots$), and $k$ is a function of Poisson's ratio $\sigma$ and is represented by $k=\{2(1-\sigma)/(1-2\sigma)\}^{1/2}$.

2. A piezoelectric device comprising a thin plate having, as a main component, lead titanate piezoelectric ceramic material and having electrode regions and non-electrode regions on the major surfaces thereof and at least one pair of electrodes provided on said electrode region, said electrode regions having a thickness so as to vibrate in one of the harmonic overtones of the thickness-extensional mode at a preselected frequency when an electrical signal is applied to said pair of electrodes, the thickness of said non-electrode regions being less than that of said electrode regions, said material of said thin plate having a Poisson's ratio from 0.2 to 0.31, and said harmonic overtones being one of the third and fifth harmonic overtones of said thickness-extensional mode.

3. A piezoelectric device comprising a thin plate of piezoelectric material having electrode regions and non-electrode regions on the major surfaces thereof and at least one pair of input and output electrodes provided on said electrode regions, said electrode regions having a thickness so as to vibrate in the thickness-extensional mode at a preselected frequency when an electrical signal is applied to said input electrode, the thickness of said non-electrode regions being greater than said thickness of electrode region, the cut-off frequency of said thickness-extensional mode at said non-electrode region being lower than the cut-off frequency of said thickness-extensional mode at said electrode region, the relation of said piezoelectric material and said thickness-extensional mode represented by $\{(\pi p/4)+(4/k^3)\cot(\pi kp/2)\}$ being negative where $\pi$ is a circular constant, $p$ is a number of harmonic overtone of the thickness-extensional mode ($p=1,3,5\ldots$) and $k$ is a function of poisson's ratio $\sigma$ and represented by $k=\{2(1-\sigma)/(1-2\sigma)\}^{1/2}$, and said thin plate having both symmetric mode and antisymmetric mode of said thickness-extensional mode.

4. A piezoelectric device comprising a thin plate of piezoelectric material having electrode regions and non-electrode regions on the major surfaces thereof and at least one pair of electrodes provided on said electrode regions, said electrode regions having a thickness so as to vibrate in one of the harmonic overtones of the thickness-shear mode at a preselected frequency when an electrical signal is applied to said pair of electrodes, the thickness of said non-electrode regions being greater than the thickness of said electrode regions, the cut-off frequency of said harmonic overtone at said non-electrode regions being lower than the cut-off frequency of said harmonic overtone at said electrode regions, and the relation of said piezoelectric material and said harmonic overtone represented by $\{(\pi q/r)+(4/k)\cot(\pi q/2K)\}$ being negative, where $\pi$ is a circular constant, $q$ is a number of harmonic overtone of said thickness-shear mode ($q=3,5,6\ldots$) and $k$ is a function of Poisson's ratio $\sigma$ and is represented by $k=\{2(1-\sigma)/(1-2\sigma)\}^{1/2}$.

5. A piezoelectric device as claimed in claim 4, wherein said thin plate comprises, as a main component, lead titanate piezoelectric ceramic material.

6. A piezoelectric device comprising a thin plate of piezoelectric material having electrode regions and non-electrode regions on the major surfaces thereof and at least one pair of input and output electrodes provided on said electrode regions, said electrode regions having a thickness so as to vibrate in one of the harmonic overtones of the thickness-shear mode at a preselected frequency when an electrical signal is applied to said input electrodes, the thickness of said non-electrode regions being greater than said thickness of electrode regions, the cut-off frequency of said harmonic overtone at said non-electrode regions being lower than the cut-off frequency of said harmonic overtone at said electrode regions, the relation of said piezoelectric material and said harmonic overtone of the thickness-shear mode represented by $\{(\pi q/4)+(4/k)\cot(\pi q/2k)\}$ being negative where $\pi$ is a circular constant $q$ is a number of said harmonic overtone of the thickness-shear mode ($q=3,5,7\ldots$) and $k$ is a function of Poisson's ratio $\sigma$ and is represented by $k=\{2(1-\sigma)/(1-2\sigma)\}^{1/2}$, said thin plate having both symmetric mode and anti-symmetric mode overtone of the thickness-shear mode.

* * * * *